United States Patent
Yamaguchi et al.

[11] Patent Number: 6,130,589
[45] Date of Patent: Oct. 10, 2000

[54] MATCHING CIRCUIT AND A METHOD FOR MATCHING A TRANSISTOR CIRCUIT

[75] Inventors: Keiko Yamaguchi; Naotaka Iwata, both of Tokyo, Japan

[73] Assignee: NEC Corporation, Tokyo, Japan

[21] Appl. No.: 09/090,151

[22] Filed: Jun. 4, 1998

[30] Foreign Application Priority Data

Jun. 4, 1997 [JP] Japan ..................................... 9-146697

[51] Int. Cl.$^7$ ...................................................... H03H 7/38
[52] U.S. Cl. ............................................. 333/32; 330/302
[58] Field of Search ............................. 333/32; 330/302, 330/144, 192

[56] References Cited

U.S. PATENT DOCUMENTS

| | | | |
|---|---|---|---|
| 4,048,598 | 9/1977 | Knight | 333/32 X |
| 4,090,150 | 5/1978 | Vachenauer | 330/302 |
| 4,835,485 | 5/1989 | Mueller | 330/302 X |
| 4,994,761 | 2/1991 | Craft | 330/302 |
| 5,095,285 | 3/1992 | Khatibzadeh | 333/32 X |
| 5,216,392 | 6/1993 | Fraser et al. | 333/32 X |
| 5,274,341 | 12/1993 | Sekine et al. | 330/269 |
| 5,325,067 | 6/1994 | Masuda et al. | 333/32 X |
| 5,339,048 | 8/1994 | Weber | 330/302 |
| 5,343,172 | 8/1994 | Utsu et al. | 333/32 |
| 5,361,403 | 11/1994 | Dent | 455/74 |
| 5,673,001 | 9/1997 | Kim et al. | 330/284 |
| 5,708,573 | 1/1998 | Lusher et al. | 333/32 X |
| 5,880,635 | 3/1999 | Satoh | 330/144 |

FOREIGN PATENT DOCUMENTS

| | | |
|---|---|---|
| 0 451 909 | 10/1991 | European Pat. Off. . |
| 38 32 293 | 4/1989 | Germany . |
| 3-66206 | 3/1991 | Japan . |
| 3-66210 | 3/1991 | Japan . |
| 3-66211 | 3/1991 | Japan . |
| 6-13806 | 1/1994 | Japan . |
| 7-38120 | 2/1995 | Japan . |
| 8-130423 | 5/1996 | Japan . |
| 8-204463 | 8/1996 | Japan . |

OTHER PUBLICATIONS

"Application to the GaAs–IC Process of High Dielectgric SrTio$_3$ thin Film Capacity Elements by Means of the Spattering Method" 55–60, Technology Report, vol. 93, No. 416, Jan. 20, 1994.

"SrTio$_3$ Capacitor with relative Dielectric Constant of 200 on GaAs Substrate at Microwave Frequency", pp. L1683–L–1684, Japanese Journal of Applied Physics, vol. 35, Nov. 12, Dec. 15, 1996.

*Primary Examiner*—Robert Pascal
*Assistant Examiner*—Barbara Summons
*Attorney, Agent, or Firm*—Young & Thomspon

[57] ABSTRACT

A matching circuit is formed by a series inductor, a parallel capacitor, a drain bias circuit, and a DC-blocking capacitor for the purpose of impedance matching. A capacitor having a capacitance that is dependent upon the bias voltage is used as the parallel capacitor. This can be, for example, a material such as a $(Ba_xSr_{1-x})TiO_3$ thin-film, which exhibits a capacitance having a bias voltage dependency. Because this thin-film capacitor exhibits polarization by an electrical field, its capacitance is the largest with a bias of 0 volts, and is reduced to approximately 50% as the bias voltage is increased. By using this capacitor in a matching circuit, it is possible to change the matching condition as the output power is increased, that is, as the voltage applied to the capacitor is increased. By considering both the condition which results in good transistor output power and the condition which results in good distortion characteristics, it is possible to achieve a design in which the matching conditions are changed from a condition that emphasizes output power, to a condition that emphasizes low distortion, as the output power increases.

8 Claims, 3 Drawing Sheets

MATCHING CIRCUIT AND A METHOD FOR MATCHING A TRANSISTOR CIRCUIT

BACKGROUND OF THE INVENTION

1. Field of the Invention

The present invention relates to a matching circuit of an amplifier which amplifies a microwave signal or millimeter wave signal such as encountered in mobile communications, and relates to a low distortion transistor circuit using a matching circuit.

2. Description of Related Art

With the appearance of high-capacity digital mobile communications systems, there is an increased demand for low-distortion, high-output power amplifiers. Along with this, in order to lengthen the possible total connect time for mobile telephone systems, there is a demand for high-output power amplifiers which operates with high efficiency. In the past, the feedback method and pre-distortion method have been investigated for use in achieving distortion compensation in high-output power amplifiers. Another method of distortion compensation is, for example, as indicated at the 1996 Electronics Society Conference C-94 of the Institute of Electronics, Information and Communication Engineers of Japan, that of using series diode linearization, or that of using a combination of a silicon bipolar transistor and a preamplifier or applying a source inductor.

In the above-noted distortion compensation circuits, however, because the attenuator circuit is provided before the power amplifier to be distortion-compensated for the purpose of adjusting level, the circuit configuration is both complex and large, thus making it difficult to achieve a compact circuit.

In view of the above-described drawbacks in the prior art, an object of the present invention is to provide circuit configuration technology that enables the implementation of a compact, low-distortion high-output power amplifier using a simple fabrication method, while also providing high-efficiency operation.

SUMMARY OF THE INVENTION

To achieve the above-noted object, the first embodiment of the present invention uses a capacitor, the capacitance of which is bias voltage dependent for the purpose of impedance matching.

The second embodiment of the present invention uses a first Tog capacitor having a capacitance that is bias voltage dependent for the purpose of impedance matching at the fundamental frequency, and uses a second capacitor having a capacitance that is not bias voltage dependent for impedance matching with respect to harmonics thereof.

A method for matching a transistor circuit is disclosed, comprising transistors and a matching circuit which is provided on an output portion of said transistor, and a capacitor, a capacitance of which being varied in response to bias voltage, wherein said method comprises the steps of: a first step of varying an output voltage of said transistor; a second step of varying a capacitance of said capacitor in response to said output voltage of said transistor; a third step of varying a matching condition by a variation of said capacitance of said capacitor; and a fourth step of adjusting the distortion of the output voltage of said transistor in response to a change of said capacitance of said capacitor.

By using a capacitor having a capacitance that is bias voltage dependent in an impedance matching circuit, with an increase in output power, that is, with an increase in the voltage that is applied to the matching circuit capacitor, it is possible to vary the matching condition. By doing this, as the output power increases, it is possible to have the matching conditions change from emphasis on output power to emphasis on distortion compensation.

In a configuration having a first capacitor with a capacitance that is dependent upon the bias voltage used for fundamental frequency impedance matching and a second capacitor with a capacitance that is not dependent upon the bias voltage used for harmonics impedance matching, accompanying an increase in the output power, whereas the fundamental frequency impedance changes, the matching condition with respect to harmonics does not. Therefore, harmonics are always suppressed, thereby enabling high-efficiency operation.

DETAILED DESCRIPTION OF THE PREFERRED EMBODIMENTS

Embodiments of present invention are described below, with reference being made to the relevant accompanying drawings.

Figure 1:
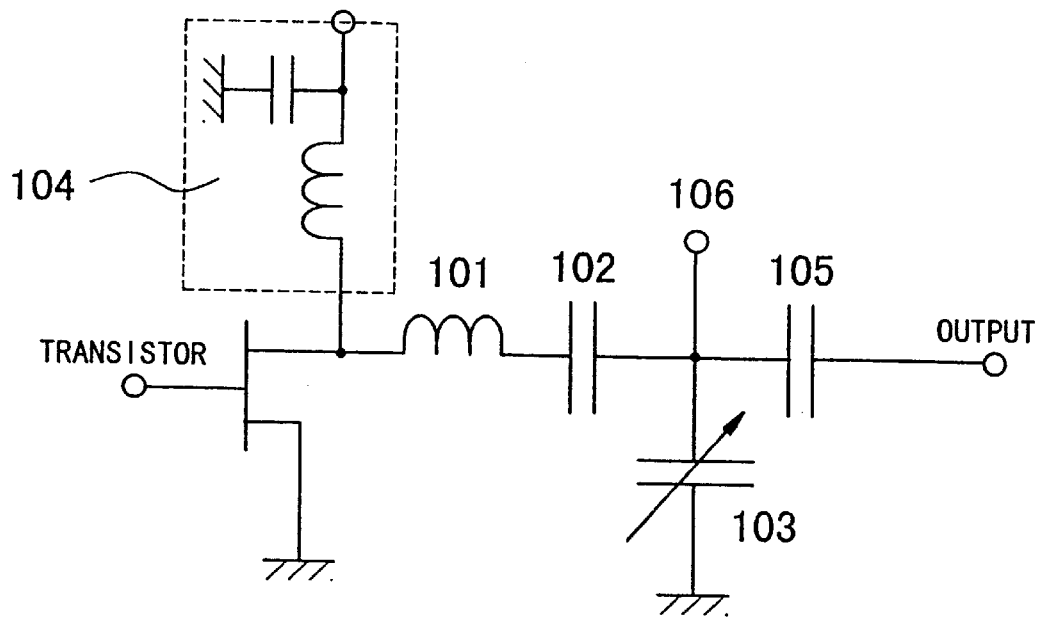
FIG. 1 is an equivalent circuit diagram of the first embodiment of the present invention.

The matching circuit of the first embodiment indicates a matching circuit according to the present invention as an output matching circuit. FIG. 1 is an equivalent circuit diagram of the first embodiment of the present invention, which is made up of a series inductor 101, a series capacitor 102, a parallel capacitor 103, a drain bias circuit 104, and a DC blocking capacitor 105. With the exception of the fact that this circuit configuration uses a capacitor having a capacitance that is dependent upon the bias voltage as the parallel capacitor 103, it is not much different from a matching circuit that is generally used.

A thin-film capacitor made of a material such as $(Ba_xSr_{1-x})TiO_3$, $Pb(Zr_xTi_{1-x})O_3$, $SrBi_2Ti_{2-x}Nb_xO_9$, $BaTiO_3$, $PbTiO_3$, or $SrTiO_3$ can be used as a capacitor having a capacitance that is dependent upon the bias voltage. Of these capacitor materials, the bias voltage dependency of the capacitance of a $(Ba_xSr_{1-x})TiO_3$ thin-film capacitor has been indicated, for example, at the 59th Spring Applied Physics Society, noted in report 28p-ZF-9.

Figure 2:
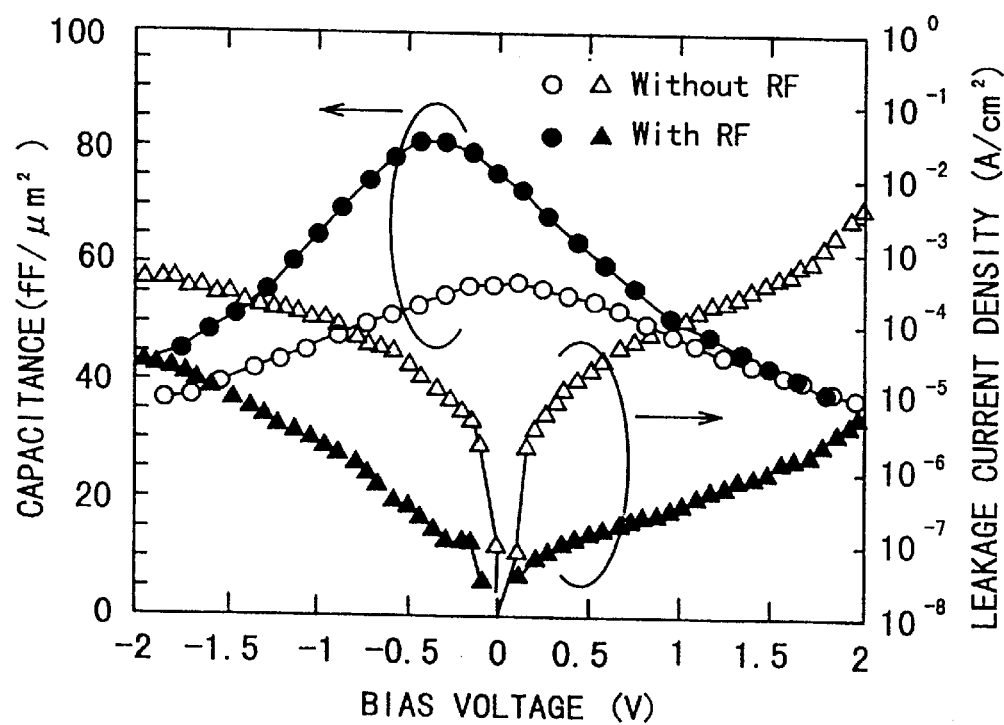
FIG. 2 is a drawing which shows the bias voltage dependency of the capacitance of a $(Ba_xSr_{1-x})TiO_3$ thin-film capacitor in the first embodiment of the present invention.

FIG. 2 shows the bias voltage dependency of the capacitance of a $(Ba_xSr_{1-x})TiO_3$ thin-film capacitor with and without the application of RF power to the substrate during the film deposition. Because $(Ba_xSr_{1-x})TiO_3$ is polarized by an electrical field, the capacitance is the largest with a bias voltage of 0 volts. The capacitance decreases as the bias voltage is increased. In the case in which RF power is applied, there is a change of approximately 50% in the capacitance as shown in FIG. 2. Therefore, by using a $(Ba_xSr_{1-x})TiO_3$ capacitor, it is possible to change the matching conditions with an increase in output power, that is, with an increase in the voltage applied to the matching circuit capacitor. FIG. 2 also shows leakage current of a $(Ba_xSr_{1-x})TiO_3$ thin-film capacitor.

Figure 3:
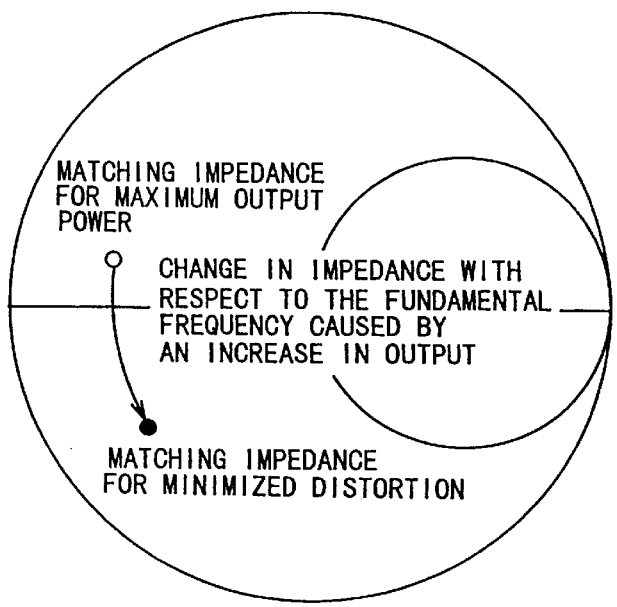
FIG. 3 is a schematic drawing which shows the principle of the first embodiment of the present invention.

FIG. 3 is a schematic representation of the principle of the present invention which is shown on the impedance chart. If the matching conditions that attain good transistor output and distortion characteristics are both evaluated, the design can be made so that, with an increase in the output power the matching condition is changed from a condition that places emphasis on output power to a condition that places emphasis on distortion compensation.

Figure 4:
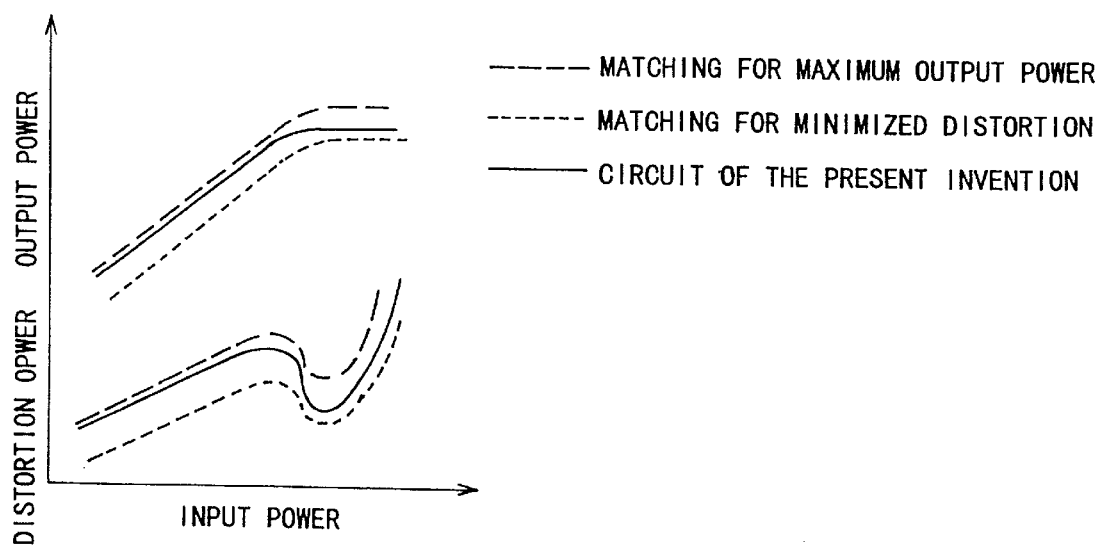
FIG. 4 is drawing which shows the effect of the first embodiment of the present invention.

FIG. 4 shows the dependency of output power and distortion output on the input power. A matching circuit according to the present invention enables attainment of low distortion even at high output power, without reducing the gain. In a case in which the direction or absolute value of capacitance change is not appropriate, it is possible to provide a capacitor bias circuit connected to terminal 106 in FIG. 1 or to increase the inductance and capacitance in the matching circuit.

Figure 5:
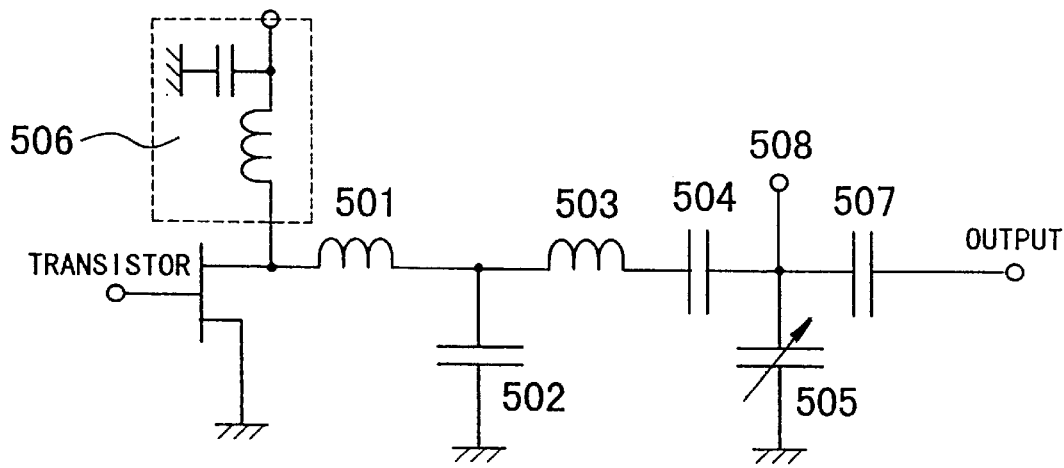
FIG. 5 is an equivalent circuit diagram of the second embodiment of the present invention.

The matching circuit of the second embodiment indicates a matching circuit according to the present invention as an output matching circuit. FIG. 5 is an equivalent circuit diagram of the second embodiment of the present invention, which is made up of a series inductor 501, a parallel capacitor 502 for the purpose of suppressing the second harmonic frequency, a series inductor 503, a series capacitor 504, a parallel capacitor 505, a drain bias circuit 506, and a DC blocking capacitor 507. This circuit configuration uses a capacitor having a capacitance that is not dependent upon the bias voltage as the parallel capacitor 502 which is used for suppressing of the second harmonic frequency, and uses a capacitor having a capacitance that is dependent upon the bias voltage as the parallel capacitor 505. With the exception of the fact that this circuit configuration uses a capacitor having a capacitance that is dependent upon the bias voltage as the parallel capacitor 505, it is not much different from a matching circuit that is generally used.

Although FIGS. 1 and 5 use standard variable capacitor symbology to represent the variable capacitance of elements 103 and 505 which have capacitances dependent upon the applied bias voltage, use of this symbology is not intended to represent a mechanically variable capacitance.

A thin-film capacitor made of a material such as $(Ba_xSr_{1-x})TiO_3$, $Pb(Zr_xTi_{1-x})O_3$, $SrBi_2Ti_{2-x}Nb_xO_9$, $BaTiO_3$, $PbTiO_3$, or $SrTiO_3$ can be used as a capacitor having a capacitance that is dependent upon the bias voltage. Of these capacitor materials, the bias voltage dependency of the capacitance of a $(Ba_xSr_{1-x})TiO_3$ thin-film capacitor has been indicated, for example, at the 59th Spring Applied Physics Society, noted in report 28p-ZF-9, in which it was indicated that, in the case of applying RF power to the substrate during the film deposition, there is a change in the capacitance of approximately 50%. Therefore, by using a $(Ba_xSr_{1-x})TiO_3$ capacitor in a matching circuit, it is possible to change the matching conditions with an increase in output power, that is, with an increase in the voltage applied to the matching circuit capacitor.

Figure 6:
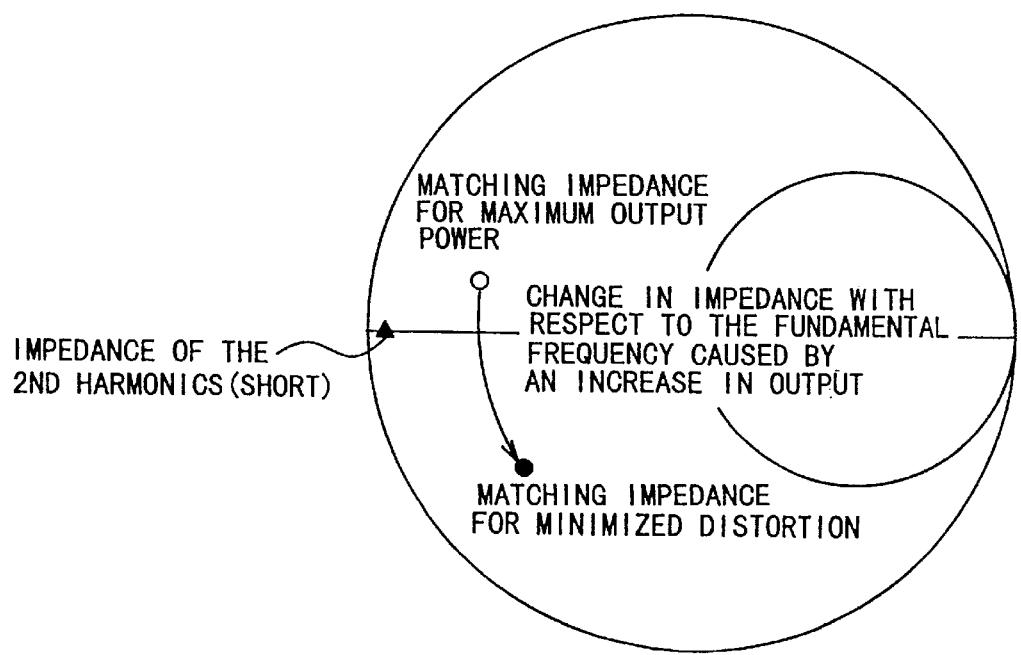
FIG. 6 is a schematic drawing which shows the principle of the second embodiment of the present invention.

FIG. 6 is a schematic representation of the principle of the present invention which is shown on the impedance chart. If the matching conditions that attain good transistor output power and distortion characteristics are both evaluated, the design can be made so that, with an increase in the output power the matching condition is changed from a condition that places emphasis on output power to a condition that places emphasis on distortion compensation. By doing this, it is possible to attain low distortion even at a high output power. In a case in which the direction or absolute value of capacitance change is not appropriate, it is possible to provide a capacitor bias circuit connected to terminal 508 in FIG. 5, or to increase the inductance and capacitance in the matching circuit. An $SiN_X$ capacitor can be used as the capacitor having a capacitance that is not dependent on the bias voltage, which is used for suppressing of the second harmonic frequency. The series inductor 501 and the parallel capacitor 502 are designed to achieve a condition in which the second harmonic frequency is shorted. Because the capacitor used as the parallel capacitor 502 has a capacitance that is not dependent upon the bias voltage, the matching conditions for the second harmonic frequency do not change with an increase in the output power. Thus, the second harmonic frequency is always suppressed, enabling the attainment of a high operating efficiency.

The first effect of the present invention is that, by using a capacitor having a capacitance that is dependent upon the bias voltage, so that as the output power increases the matching condition is changed from one that emphasizes output power to one that emphasizes low distortion, thereby eliminating the distortion compensation circuit used in the past. It is therefore possible to attain a significant reduction in the surface area occupied by the circuit. Additionally, the simplicity of the circuit configuration is effective in reducing cost.

The second effect of the present invention is that, by using a first capacitor having a capacitance that is dependent upon the bias voltage so that the matching condition is changed from a condition with emphasis on output power to one with emphasis on low distortion, and by using a second capacitor with a capacitance that is not dependent upon the bias voltage to achieve shorting of the second harmonic frequency, it is possible to achieve not only low-distortion characteristics, but also highly efficient operation, using a simple, compact circuit configuration. Additionally, by suppressing second and higher harmonics as well, it is possible to achieve even higher efficiency.

What is claimed is:

1. A matching circuit comprising:
   a transistor having an input for receiving an input signal;
   a series resonant circuit comprising an inductor and a first capacitor connected between an output of said transistor and an intermediate node;
   a series-connected DC-blocking capacitor connected between said intermediate node and an output terminal;
   a thin-film variable capacitor connected between said intermediate node and a ground potential, said thin-film variable capacitor having a capacitance set by a bias voltage for impedance matching at a fundamental frequency of said input signal, said bias voltage being supplied by at least one of said output of said transistor and a voltage applied at said intermediate node.

2. The matching circuit of claim 1, further comprising a drain bias circuit connected to an output of said transistor, said drain bias circuit comprising a lowpass filter for preventing leakage of a RF signal in said output of said transistor to a DC power supply.

3. The matching circuit of claim 1, further comprising an external bias voltage terminal connected to said intermediate node for receiving an external bias voltage, said bias voltage being supplied by said external bias voltage.

4. A matching circuit comprising:
   a transistor having an input for receiving an input signal;

a lowpass filter having an input connected to an output of said transistor, said lowpass filter comprising a first series inductor connected at a first end to said lowpass filter input, and at a second end to one terminal of a first capacitor, said first capacitor being connected at a second terminal to a ground potential for suppressing passage of harmonic frequencies of said input signal;

a bandpass filter for passing a fundamental frequency of said input signal, said bandpass filter being connected between an output of said lowpass filter and an intermediate node, said bandpass filter comprising a second inductor and a second capacitor connected in series;

a series-connected DC-blocking capacitor connected between said intermediate node and an output terminal; and a variable capacitor connected between said intermediate node and a ground potential, said variable capacitor having a capacitance variably determined by a bias voltage for impedance matching at a fundamental frequency of said input signal, said bias voltage being supplied by at least one of said output of said transistor and a voltage applied at said intermediate node.

5. The matching circuit of claim 4, further comprising a drain bias circuit connected to said transistor output, said drain bias circuit comprising a lowpass filter for preventing leakage of a RF signal in said output of said transistor to a DC power supply.

6. The matching circuit of claim 4, further comprising an external bias voltage terminal connected to said intermediate node for receiving an external bias voltage, said bias voltage being supplied by said external bias voltage.

7. The matching circuit of claim 4, wherein said variable capacitor is of a thin-film capacitor type.

8. A method for matching a transistor circuit to an output load, wherein the matching circuit comprises a series inductor and a capacitor connected to ground so as to form a lowpass filter having an input connected to the transistor circuit output, and having an output connected to an inductor and capacitor connected in series so as to form a bandpass filter connected to both an output load terminal and a variable capacitor to ground having a capacitance dependent on a changeable bias voltage, the method comprising the steps of:

matching output impedance of the transistor with the input impedance of the output load for maximum output power;

suppressing harmonic frequencies of a transistor output signal;

varying a capacitance of the variable capacitor in response to a transistor output voltage change to match the impedance of the transistor output with the output load impedance at a fundamental frequency of the input signal; and varying the distortion power present in the output signal in response to a change in the variable capacitance.

* * * * *